(12) United States Patent
Mossawir

(10) Patent No.: US 8,847,688 B1
(45) Date of Patent: Sep. 30, 2014

(54) OVER-VOLTAGE PROTECTION IN A HIGH-SWING AMPLIFIER

(75) Inventor: Benjamin Joseph Mossawir, San Carlos, CA (US)

(73) Assignee: Google Inc., Mountain View, CA (US)

( * ) Notice: Subject to any disclaimer, the term of this patent is extended or adjusted under 35 U.S.C. 154(b) by 25 days.

(21) Appl. No.: 13/566,120

(22) Filed: Aug. 3, 2012

(51) Int. Cl.
*H03F 3/04* (2006.01)

(52) U.S. Cl.
USPC .......................................... 330/296; 330/298

(58) Field of Classification Search
USPC ............... 330/285, 296–298, 207 P, 311, 127
See application file for complete search history.

(56) References Cited

U.S. PATENT DOCUMENTS

| | | | |
|---|---|---|---|
| 5,296,756 A | 3/1994 | Patel et al. | |
| 6,760,381 B2 | 7/2004 | Lu | |
| 7,292,015 B2 | 11/2007 | Oswald et al. | |
| 7,714,617 B2 | 5/2010 | Lee | |
| 8,008,974 B2 * | 8/2011 | Ha et al. | 330/285 |

* cited by examiner

*Primary Examiner* — Hieu Nguyen
(74) *Attorney, Agent, or Firm* — Morris & Kamlay LLP

(57) ABSTRACT

A method for processing signals may include comparing an output voltage signal in an output stage of an amplifier with a reference voltage signal. If the output voltage signal is greater than the reference voltage signal, a comparator voltage signal may be generated. Bias voltage for at least one output stage transistor may be increased by increasing current generated by a first bias current source of the at least one output stage transistor. The current may be increased in proportion to the generated comparator voltage signal. The output voltage signal may be divided prior to the comparing. The at least one output stage transistor may be dynamically biased based on the generated comparator voltage signal. The comparator voltage signal may be generated using at least one differential pair with a current mirror load.

17 Claims, 8 Drawing Sheets

Over-Voltage Protection – High Side

OVER-VOLTAGE PROTECTION IN A HIGH-SWING AMPLIFIER

TECHNICAL FIELD

Aspects of the present application relate generally to the field of processing signals within an amplifier. More specifically, certain implementations of the present disclosure relate to over-voltage protection in a high-swing amplifier.

BACKGROUND

An integrated Asymmetric Digital Subscriber Line (ADSL) line driver is designed to transmit high-power (e.g., 25 kHz-2.2 MHz) Discrete Multi-Tone (DMT) signals into a transformer-coupled 100-ohm line. Despite the mitigating effect of the transformer ratio, the voltage swing at the chipside coil typically exceeds the reliability limits of core devices in a scaled CMOS process. Even input/output (I/O) devices may not be able to handle the peak voltage when the transmitted and terminated DMT signals combine constructively, let alone the high voltages associated with fault conditions, such as shorting the output to the supply. For example, a line driver designed in a 1.8V/3.3V CMOS process whose output stage runs off a 5V supply, must support a differential output swing of 4 Vpp. To prevent high stress that accelerates aging and may precipitate premature fatigue, or worse, catastrophic damage to the part, transistors in the critical region of the output stage must be protected against over-voltage conditions. Such protection circuits should consume minimal chip resources (including area and power), while not interfering with mission-mode operation of the line driver.

Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for over-voltage protection in a high-swing amplifier, substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

In an embodiment of the disclosure, a method for processing signals may include comparing an output voltage signal in an output stage of an amplifier with a reference voltage signal; generating a comparator voltage signal, if the output voltage signal is greater than the reference voltage signal; and increasing bias voltage for at least one output stage transistor by increasing current generated by a first bias current source of the at least one output stage transistor, in proportion to the generated comparator voltage signal. The output voltage signal may be divided prior to the comparing. The at least one output stage transistor may be dynamically biased based on the generated comparator voltage signal. The comparator voltage signal may be generated using at least one differential pair with a current mirror load. The bias voltage for the at least one output stage transistor may include a fixed voltage component and a variable voltage component.

The fixed voltage component may be generated using a fixed resistor load and a second bias current source of the at least one output stage transistor. The bias voltage may be incremented for the at least one output stage transistor by overdriving the variable voltage component of the bias voltage. The overdriving may include increasing the current generated by the first bias current source of the at least one output stage transistor. The current may pass through a replica diode of the at least one output stage transistor and a second fixed resistor load.

In accordance with another embodiment of the disclosure, a method for processing signals may include comparing an output voltage signal in an output stage of an amplifier with a reference voltage signal; generating a comparator voltage signal, if the output voltage signal is less than the reference voltage signal; and decreasing bias voltage for at least one output stage transistor by increasing current generated by a first bias current source of the at least one output stage transistor, in proportion to the generated comparator voltage signal. The output voltage signal may be divided prior to the comparing. The at least one output stage transistor may be dynamically biased based on the generated comparator voltage signal. The comparator voltage signal may be generated using at least one differential pair with a current mirror load. The bias voltage for the at least one output stage transistor may include a fixed voltage component and a variable voltage component.

The fixed voltage component may be generated using a fixed resistor load and a second bias current source of the at least one output stage transistor. The bias voltage for the at least one output stage transistor may be decreased by overdriving the variable voltage component of the bias voltage. The overdriving may include increasing the current generated by the first bias current source of the at least one output stage transistor. The current may pass through a replica diode of the at least one output stage transistor and a second fixed resistor load.

In accordance with yet another embodiment of the disclosure, an over-voltage protection circuit may include a divider that is operable to divide an output voltage signal in an output stage of an amplifier to generate a divided output voltage signal; a comparator that is operable to compare the divided output voltage signal in with a reference voltage signal to generate a comparator voltage signal; and a first bias current source coupled to the comparator and at least one output stage transistor. The first bias current source may be operable to increase bias voltage, if the divided output voltage signal is greater than the reference voltage signal, for the at least one output stage transistor by increasing current in proportion to the generated comparator voltage signal.

The bias voltage for the at least one output stage transistor may include a fixed voltage component and a variable voltage component. The over-voltage protection circuit may also include a second bias current source of the at least one output stage transistor, the second bias current source operable to generate the fixed voltage component using a first fixed resistor load. Additionally, the over-voltage protection circuit may include a replica diode coupled to a second fixed resistor load. The first bias current source may be operable to increase the bias voltage for the at least one output stage transistor by increasing the current passing through the replica diode and the second fixed resistor load.

DETAILED DESCRIPTION

Figure 1A:
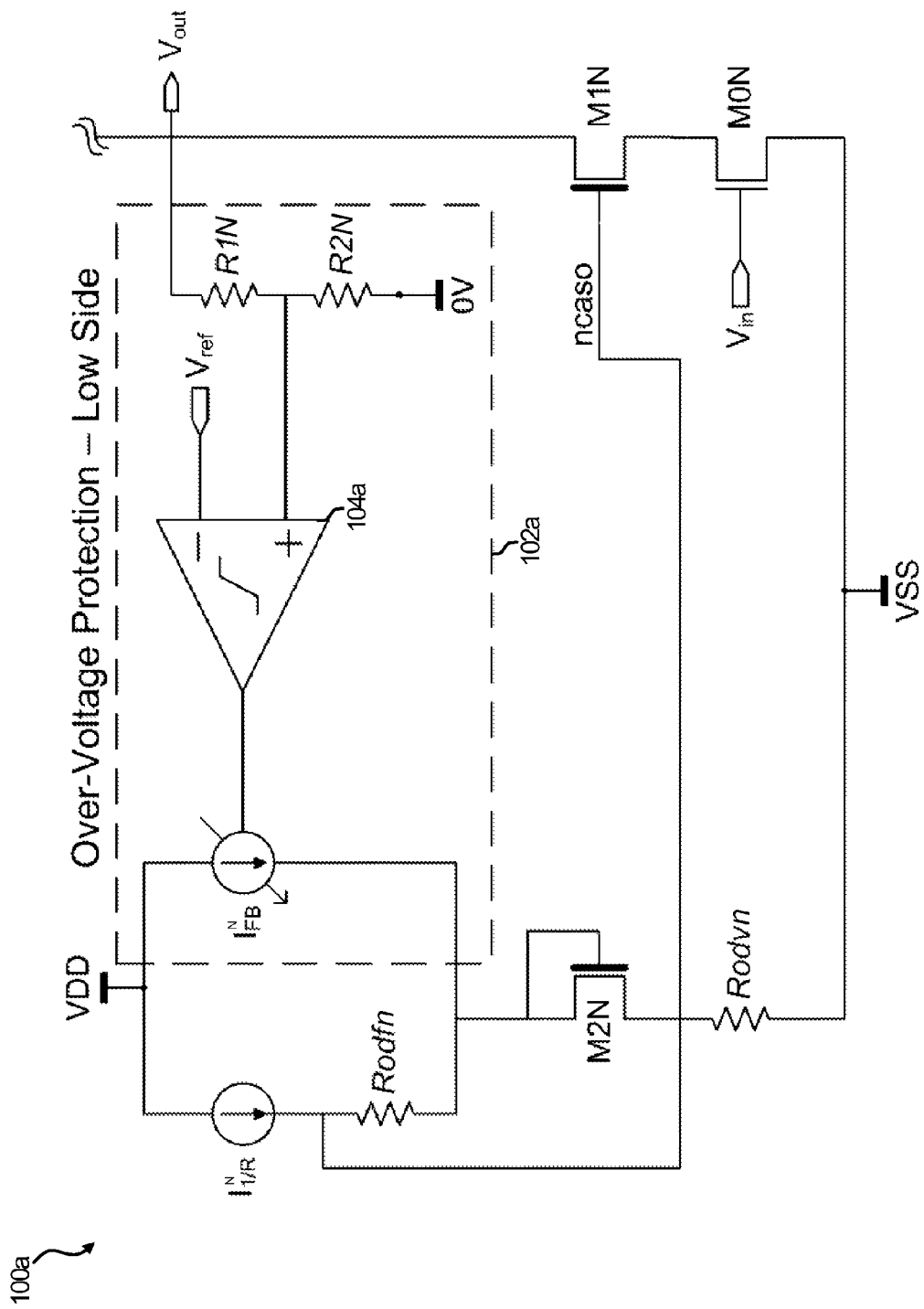
FIG. 1A is a schematic block diagram of a low side of an amplifier output stage using over-voltage protection, in accordance with an embodiment of the disclosure.

As utilized herein the terms "circuits" and "circuitry" refer to physical electronic components (i.e. hardware) and any software and/or firmware ("code") which may configure the hardware, be executed by the hardware, and or otherwise be associated with the hardware. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "e.g.," introduces a list of one or more non-limiting examples, instances, or illustrations.

The present disclosure relates to a method and system for over-voltage protection in a high-swing amplifier. In various implementations, the disclosed "over-voltage protection" circuit topology may be used for protecting a CMOS, rail-to-rail output-swing, Class-AB line driver against over-voltage damage when operating from a supply in excess of the rated I/O voltage. The disclosed topology, the low- and high-side halves of which are described herein below in reference to FIGS. 1A-2B, uses a divider to scale down the output voltage, a comparator that measures this divided voltage against a reference, and a steering network that adjusts the current in a diode-based biasing branch responsible for setting a cascode gate bias (ncaso for the low side of the output stage, and pcaso for the high side of the output stage).

By using the disclosed over-voltage protection circuit, ncaso and pcaso biasing voltages may be dynamically biased with their nominal values chosen so as to keep M0 and M1 both saturated and beneath punch-through limits at average signal power. Additionally, the feedback loop of the over-voltage protection circuit may increase ncaso when Vout exceeds the rated level (or decrease pcaso when Vout is below the rated level), thereby keeping the $V_{DS}$ voltages for the output stage transistors in safe operating ranges.

For example, a method for processing signals may include comparing an output voltage signal in an output stage of an amplifier with a reference voltage signal. If the output voltage signal is greater than the reference voltage signal, a comparator voltage signal may be generated. Bias voltage for at least one output stage transistor may be increased by increasing current generated by a first bias current source of the at least one output stage transistor. The current may be increased in proportion to the generated comparator voltage signal. The output voltage signal may be divided prior to the comparing. The at least one output stage transistor may be dynamically biased based on the generated comparator voltage signal. The comparator voltage signal may be generated using at least one differential pair with a current mirror load.

The bias voltage for the at least one output stage transistor may include a fixed voltage component and a variable voltage component. The fixed voltage component may be generated using a fixed resistor load and a second bias current source of the at least one output stage transistor. The bias voltage for the at least one output stage transistor may be increased by overdriving the variable voltage component of the bias voltage. The overdriving may include increasing the current generated by the first bias current source of the at least one output stage transistor, where the current may pass through a replica diode of the at least one output stage transistor.

FIG. 1A is a schematic block diagram of a low side of an amplifier output stage using over-voltage protection, in accordance with an embodiment of the disclosure. Referring to FIG. 1A, the amplifier output stage 100a may comprise an over-voltage protection (OVP) circuit 102a, low side output stage transistors M1N and M0N, resistors Rodfn and Rodvn, a bias current source $I^N_{1/R}$, and a diode M2N.

In accordance with an embodiment of the disclosure, the OVP circuit 102a may comprise suitable circuitry, logic and/or code and may be used to protect the low side output stage transistors M1N and M0N when Vout increases above the rated output level. More specifically, both M0N and M1N may be subject to transient $V_{DS}$ voltages in excess of their rated punch-through limits when the output voltage Vout makes an excursion to the positive rail (VDD) due to either peak signal swing or a short-to-supply fault. In such instances, statically biasing M1N may be insufficient to prevent this condition since the $V_{GS}$ of M1N may change radically with the large amount of current that can be sunk during class-B operation. Additionally, the linearity of the output stage may deteriorate if M0N drops out of saturation well before the output reaches the negative rail (VSS).

The OVP circuit 102a may comprise a resistor divider R1N-R2N, a comparator 104a, and a bias current source $I^N_{FB}$. The resistor divider R1N-R2N is operable to receive and divide the output voltage Vout. In this regard, the resistor divider R1N-R2N may ensure that the input oxides of the comparator 104a are protected from breakdown when Vout is increased to VDD.

The comparator 104a may comprise suitable circuitry, logic and/or code and may be operable to compare the voltage output generated by the resistor divider R1N-R2N with a reference voltage Vref. For example, Vref may be set to be at the level of the $V_{DS}$ voltage of M1N, where M1N still meets reliability limits. If the voltage output generated by the resistor divider R1N-R2N is greater than the reference voltage Vref, then the comparator 104a generates an output signal that triggers the first bias current source $I^N_{FB}$ to generate additional current within the amplifier output stage 100a. The additional current from the first bias current source $I^N_{FB}$ may be used for increasing the bias voltage ncaso of the output stage transistors when Vout exceeds the rated level.

The diode M2N may comprise a diode-connected transistor, which may be a replica of the output stage transistor M1N. For example, the diode M2N may be sized to match the current density of M1N when handling peak signal current (which may be lower than the peak short-circuit current). By matching diode M2N to M1N, any manufacturing deviations that affect M1N will also carry over to M2N, ensuring optimal adjustment in the bias voltage ncaso of the output stage transistors in instances when Vout exceeds the rated level.

The resistors Rodfn and Rodvn may be used to contribute a fixed and a variable voltage component, respectively, to the bias voltage ncaso. More specifically, Rodvn may be used to set the gain of the OVP circuit 102a, controlling the incremental increase in the variable voltage component of ncaso with rising Vout. Resistor Rodfn (when used with the second bias current source $I^N_{1/R}$) may be used to set the fixed voltage component of the biasing voltage ncaso to a value that is optimal for performance of the amplifier output stage 100a when the OVP circuit 102a is disengaged. In this regard, by breaking the resistive component of the bias voltage ncaso into Rodfn and Rodvn, the gain of the OVP circuit 102a and the nominal ncaso level may be set independently of each other.

In an example operation cycle, if the input voltage Vin increases, the output voltage Vout will decrease. Since a decrease in Vout will not result in a voltage higher than Vref (e.g., Vref may be equal to the $V_{DS}$ voltage of M1N, when M1N still meets reliability limits), the comparator 104a within the OVP circuit 102a will not be activated. In such instances, the bias voltage ncaso may be generated only from the second bias current source $I^N_{1/R}$ and resistor Rodfn, with its nominal value chosen so as to keep M0N and M1N both saturated and beneath punch-through limits at average signal power.

If the input voltage Vin decreases, the output voltage Vout may increase and exceed the rated level. The resistor divider R1N-R2N may divide the output voltage and may communicate the divided signal to the comparator 104a. Since the divided Vout signal exceeds the reference voltage signal Vref (which may be set at, e.g., the level at which $V_{DS}$ for M1N meets reliability limits), the comparator 104a will be triggered to output a signal to the first bias current source $I^N_{FB}$. The current contribution of $I^N_{FB}$ may then increase, which may increase the current through the diode M2N and the resistor Rodvn, resulting in higher overdrive voltage at M2N. The higher overdrive voltage at M2N may result in the incremental increase in the variable voltage component of the biasing voltage ncaso with rising Vout.

In this regard, the biasing voltage ncaso of the low side output stage transistors M1N and M0N may be dynamically biased with its nominal value (e.g., the fixed voltage component based on $I^N_1/R$ and Rodfn) selected so as to keep M0N and M1N both saturated and beneath punch-through limits at average signal power. Additionally, the OVP circuit 102a may increase the biasing voltage ncaso (e.g., the variable voltage component of ncaso based on $I^N_{FB}$, M2N and Rodvn) when Vout exceeds the rated level, thereby keeping the $V_{DS}$ voltage levels for M1N and M0N in safe operating ranges.

Figure 1B:
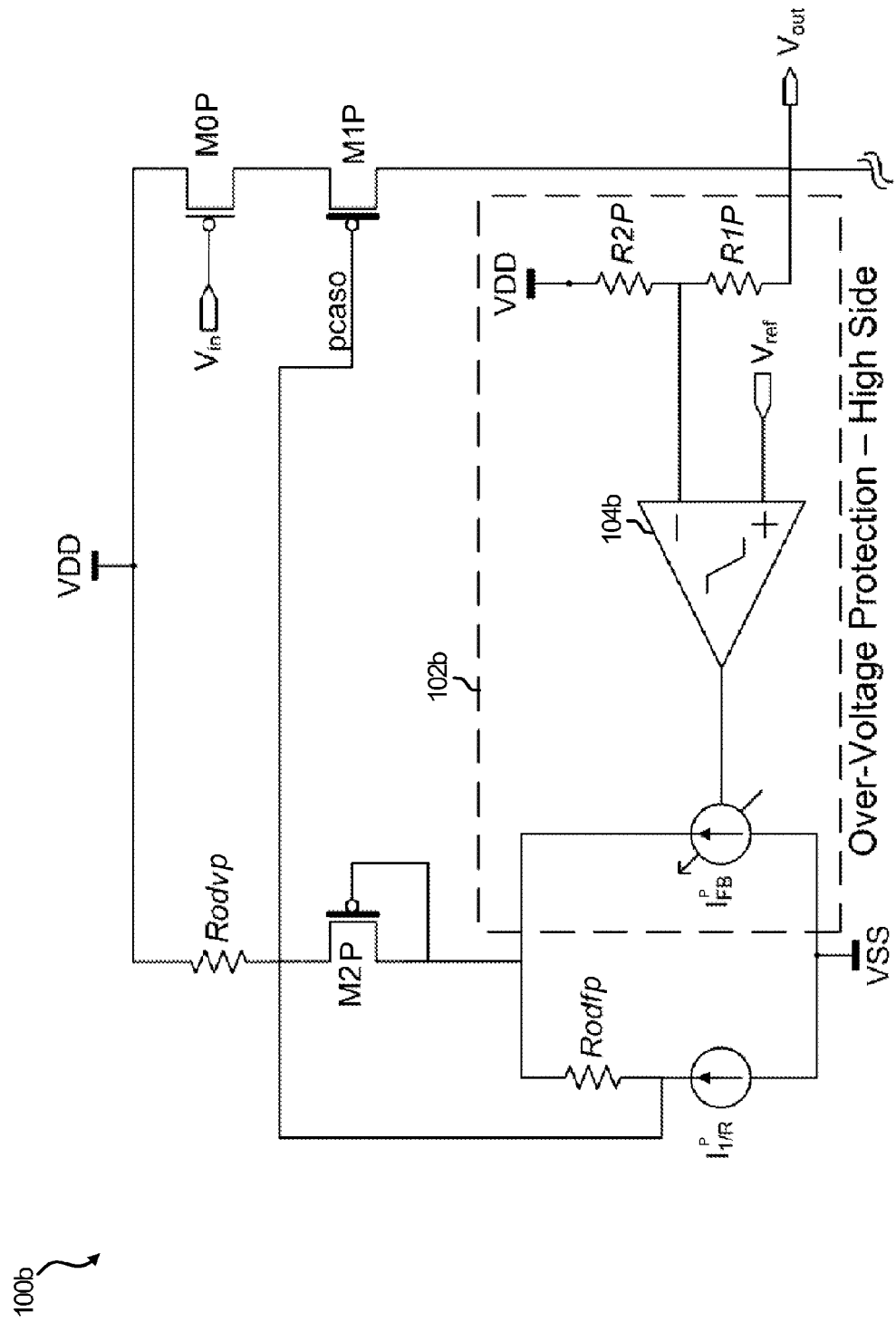
FIG. 1B is a schematic block diagram of a high side of an amplifier output stage using over-voltage protection, in accordance with an embodiment of the disclosure.

FIG. 1B is a schematic block diagram of a high side of an amplifier output stage using over-voltage protection, in accordance with an embodiment of the disclosure. Referring to FIG. 1B, the amplifier output stage 100b may comprise an over-voltage protection (OVP) circuit 102b, high side output stage transistors M1P and M0P, resistors Rodfp and Rodvp, a bias current source $I^P_{1/R}$, and a diode M2P.

In accordance with an embodiment of the disclosure, the OVP circuit 102b may comprise suitable circuitry, logic and/or code and may be used to protect the high side output stage transistors M1P and M0P when Vout decreases below the rated output level. More specifically, both M0P and M1P may be subject to transient $V_{DS}$ voltages in excess of their rated punch-through limits when the output voltage Vout decreases below the rated output level.

The OVP circuit 102b may comprise a resistor divider R1P-R2P, a comparator 104b, and a bias current source $I^P_{FB}$. The resistor divider R1P-R2P is operable to receive and divide the output voltage Vout. In this regard, the resistor divider R1P-R2P may ensure that the input oxides of the comparator 104b are protected from breakdown when Vout is decreased below the rated output voltage level.

The comparator 104b may comprise suitable circuitry, logic and/or code and may be operable to compare the voltage output generated by the resistor divider R1P-R2P with a reference voltage Vref. For example, Vref may be set to be at the level of the $Vp_s$ voltage of M1P, when M1P still meets reliability limits. If the voltage output generated by the resistor divider R1P-R2P is smaller than the reference voltage Vref, then the comparator 104a generates an output signal that triggers the first bias current source $I^P_{FB}$ to increase its current within the amplifier output stage 100b. The increased current of the first bias current source $I^P_{FB}$ may be used for decreasing the bias voltage pcaso of the output stage transistors when Vout is below the rated level.

The diode M2P may comprise a diode-connected transistor, which may be a replica of the output stage transistor M1P. For example, the diode M2P may be sized to match the current density of M1P when handling peak signal current (which may be lower than the peak short-circuit current). By matching diode M2P to M1P, any manufacturing deviations that may affect M1P will also carry over to M2P, ensuring optimal adjustment in the bias voltage pcaso of the output stage transistors in instances when Vout is below the rated level.

The resistors Rodfp and Rodvp may be used to contribute a fixed and a variable voltage component, respectively, to the bias voltage pcaso. More specifically, Rodvp may be used to set the gain of the OVP circuit 102b, controlling the incremental decrease in the variable voltage component of pcaso with falling Vout. Resistor Rodfp (when used with the second bias current source $I^P_{1/R}$) may be used to set the fixed voltage component of the biasing voltage pcaso to a value that is optimal for performance of the amplifier output stage 100b when the OVP circuit 102b is disengaged. In this regard, by breaking the resistive component of the bias voltage pcaso into Rodfp and Rodvp, the gain of the OVP circuit 102b and the nominal pcaso level may be set independently of each other.

In an example operation cycle, if the input voltage Vin decreases, the output voltage Vout will increase. Since an increase in Vout will not result in a voltage lower than Vref (e.g., Vref may be equal to the $V_{DS}$ voltage of M1P, when M1P still meets reliability limits), the comparator 104b within the OVP circuit 102b will not be activated. In such instances, the bias voltage pcaso may be generated only from the second bias current source $I^P_{1/R}$ and resistor Rodfp, with its nominal value chosen so as to keep M0P and M1P both saturated and beneath punch-through limits at average signal power.

If the input voltage Vin increases, the output voltage Vout may decrease and fall below the rated level. The resistor divider R1P-R2P may divide the output voltage and may communicate the divided signal to the comparator 104b. Since the divided Vout signal is below the reference voltage signal Vref (which may be set at, e.g., the level at which $V_{DS}$ for M1P meets reliability limits), the comparator 104b will be triggered to output a signal to the first bias current source $I^P_{FB}$. The current contribution of $I^P_{FB}$ may then increase, which will decrease the current through the diode M2P and the resistor Rodvp, resulting in a higher overdrive voltage at M2P. The higher overdrive voltage at M2P may result in the incremental decrease in the variable voltage component of the biasing voltage pcaso with a decreasing output voltage Vout.

In this regard, the biasing voltage pcaso of the high side output stage transistors M1P and M0P may be dynamically biased with its nominal value (e.g., the fixed voltage component based on $I^P_{1/R}$ and Rodfp) selected so as to keep M0P and M1P both saturated and beneath punch-through limits at average signal power. Additionally, the OVP circuit 102b may decrease the biasing voltage pcaso (e.g., the variable voltage component of pcaso based on $I^P_{FB}$, M2P and Rodvp) when Vout falls below the rated level, thereby keeping the $V_{DS}$ voltage levels for M1P and M0P in safe operating ranges.

Figure 2A:
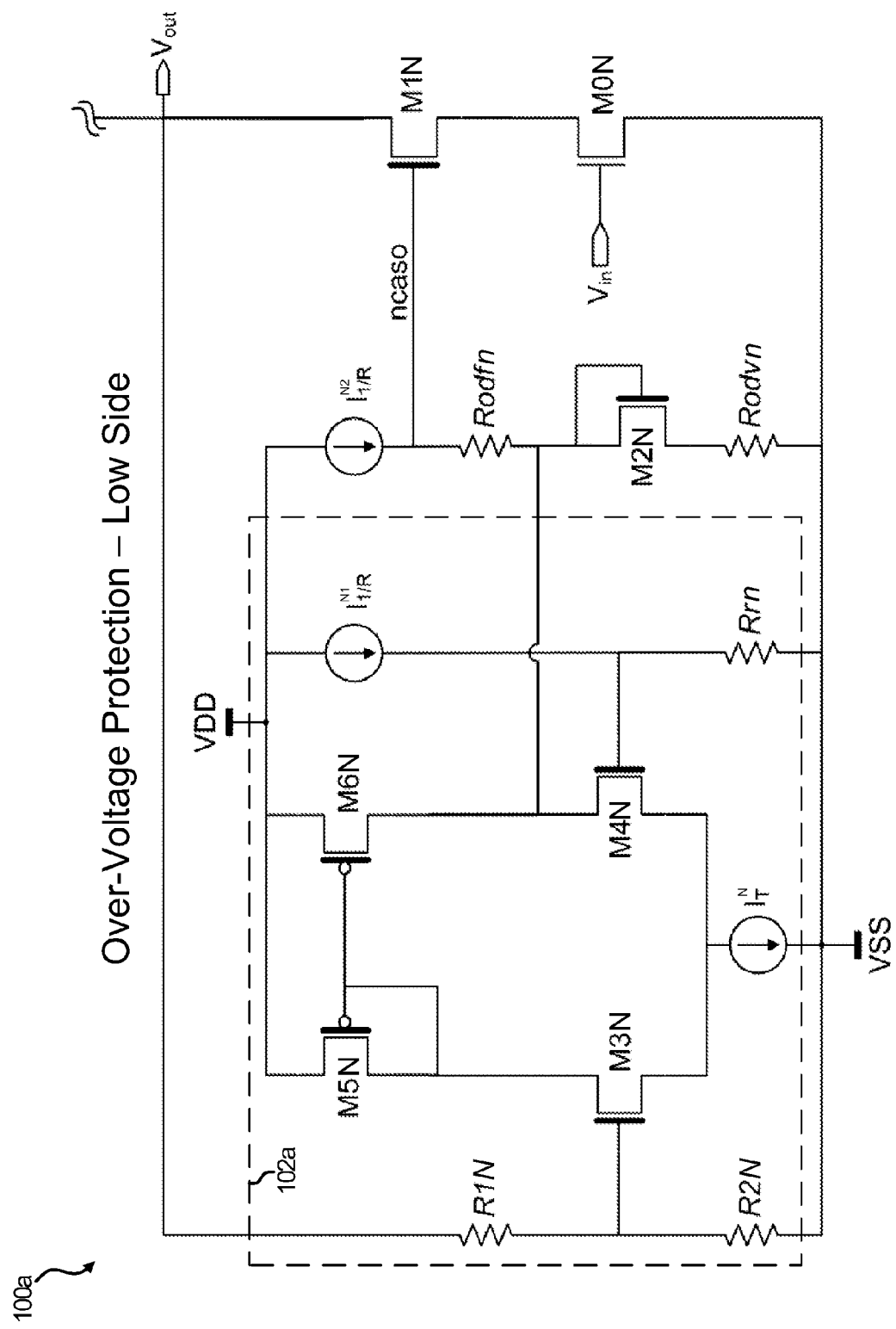
FIG. 2A is another schematic block diagram of the low side of the FIG. 1A amplifier output stage using over-voltage protection, in accordance with an embodiment of the disclosure.

FIG. 2A is another schematic block diagram of the low side of the FIG. 1A amplifier output stage using over-voltage protection, in accordance with an embodiment of the disclosure. Referring to FIG. 2A, there is illustrated the amplifier output stage 100a of FIG. 1A, with additional implementation details relating to the OVP circuit 102a. More specifically, the amplifier output stage 100a may comprise an over-voltage protection (OVP) circuit 102a, low side output stage transistors M1N and M0N, resistors Rodfn and Rodvn, a current source $I^N_{1/R}$, and a diode M2N.

The OVP circuit 102a may comprise a resistor divider R1N-R2N, a differential transistor pair M3N-M4N with a current source $I^N_T$, a current mirror load of transistors M5N-M6N, a bias current source $I^{N1}_{1/R}$, and resistor Rrn. Referring to FIGS. 1A and 2A, the comparator 104a and the first bias current source $I^N_{FB}$ may be implemented as differential transistor pair M3N-M4N with a current source $I^N_T$ and the current mirror load M5N-M6N. Additionally, the reference voltage Vref may be supplied by the combination of the bias current source $I^{N1}_{1/R}$ and resistor Rrn. Even though specific design implementation of the OVP circuit 102a is disclosed by FIG. 2A, the present disclosure may not be limited in this regard and other implementations of, for example, the comparator 104a, may be implemented.

Figure 2B:
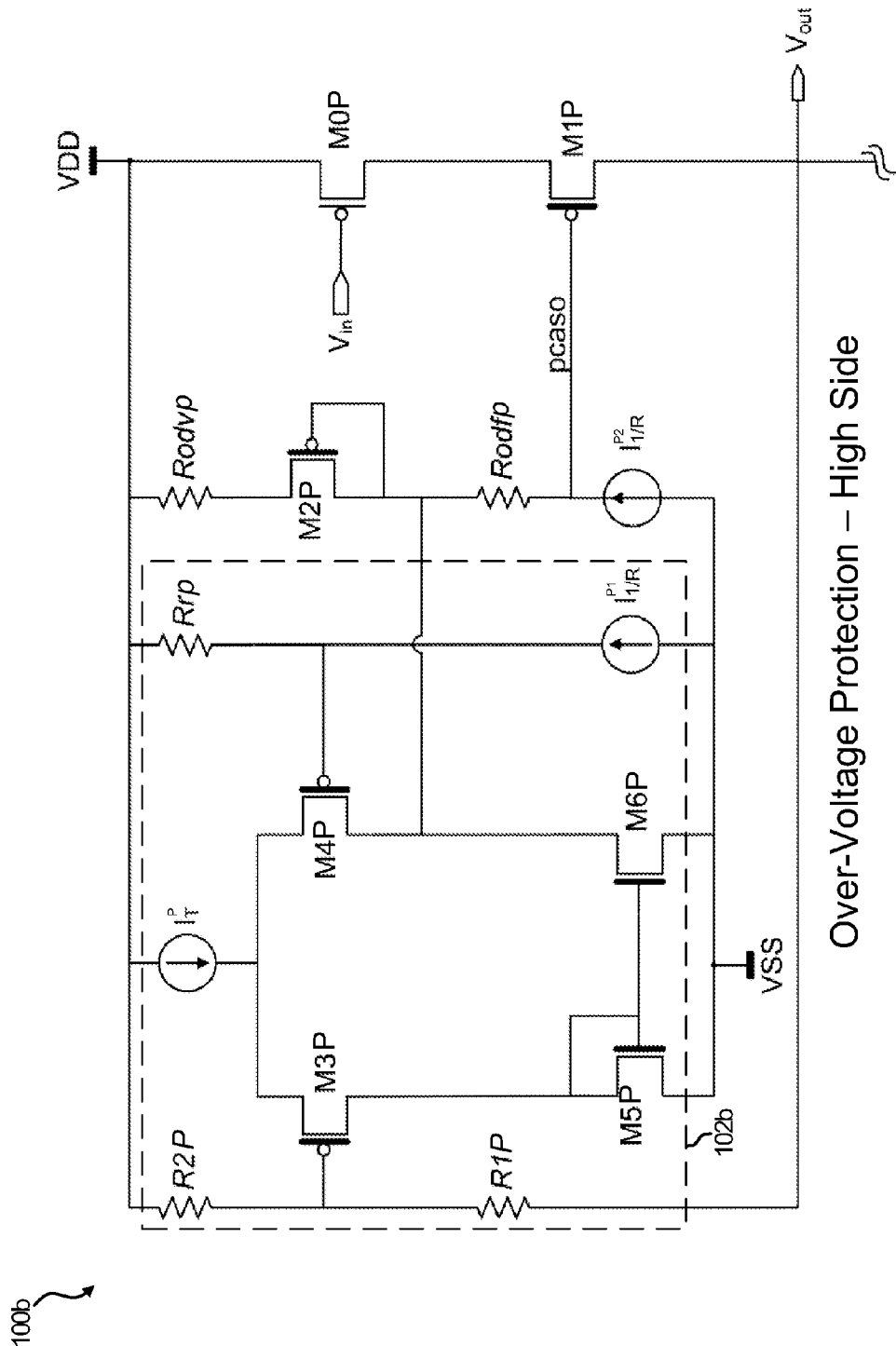
FIG. 2B is another schematic block diagram of the high side of the FIG. 1B amplifier output stage using over-voltage protection, in accordance with an embodiment of the disclosure.

FIG. 2B is another schematic block diagram of the high side of the FIG. 1B amplifier output stage using over-voltage protection, in accordance with an embodiment of the disclosure. Referring to FIG. 2B, there is illustrated the amplifier output stage 100b of FIG. 1B, with additional implementation details relating to the OVP circuit 102b. More specifically, the amplifier output stage 100b may comprise an over-voltage protection (OVP) circuit 102b, high side output stage transistors M1P and M0P, resistors Rodfp and Rodvp, a current source $I^{P2}_{1/R}$, and a diode M2P.

The OVP circuit 102b may comprise a resistor divider R1P-R2P, a differential transistor pair M3P-M4P with a current source $I^P_T$, a current mirror load of transistors M5P-M6P, a bias current source $I^{P1}_{1/R}$, and resistor Rrp. Referring to FIGS. 1B and 2B, the comparator 104b and the first bias current source $I^P_{FB}$ may be implemented as differential transistor pair M3P-M4P with a current source $I^P_T$ and the current mirror load M5P-M6P. Additionally, the reference voltage Vref may be supplied by the combination of the bias current source $I^{P1}_{1/R}$ and resistor Rrp. Even though specific design implementation of the OVP circuit 102b is disclosed by FIG. 2B, the present disclosure may not be limited in this regard and other implementations of, for example, the comparator 104b, may be implemented.

In accordance with an embodiment of the disclosure, the amplifier output stages 100a (FIGS. 1A, 2A) and 100b (FIGS. 1B, 2B) may be implemented as a single integrated circuit. Additionally, in reference to FIGS. 1A-2B, the resistor Rodf (Rodfn and Rodfp) may be sized to provide high enough ncaso (or low enough pcaso) for mission-mode reliability of the output stage transistors M0-M1. The resistor Rodv (Rodvn and Rodvp) may be sized to provide sufficient gain in the feedback loop of the OVP circuit (104a, 104b) for handling short-to-supply events. Furthermore, the differential pair M3-M4 (M3N-M4N or M3P-M4P) may be biased with high overdrive to achieve a soft comparator (104a or 104b) so that ncaso (or pcaso) scales approximately linearly with the output voltage Vout when it is above (or below) its threshold.

Figure 3A:
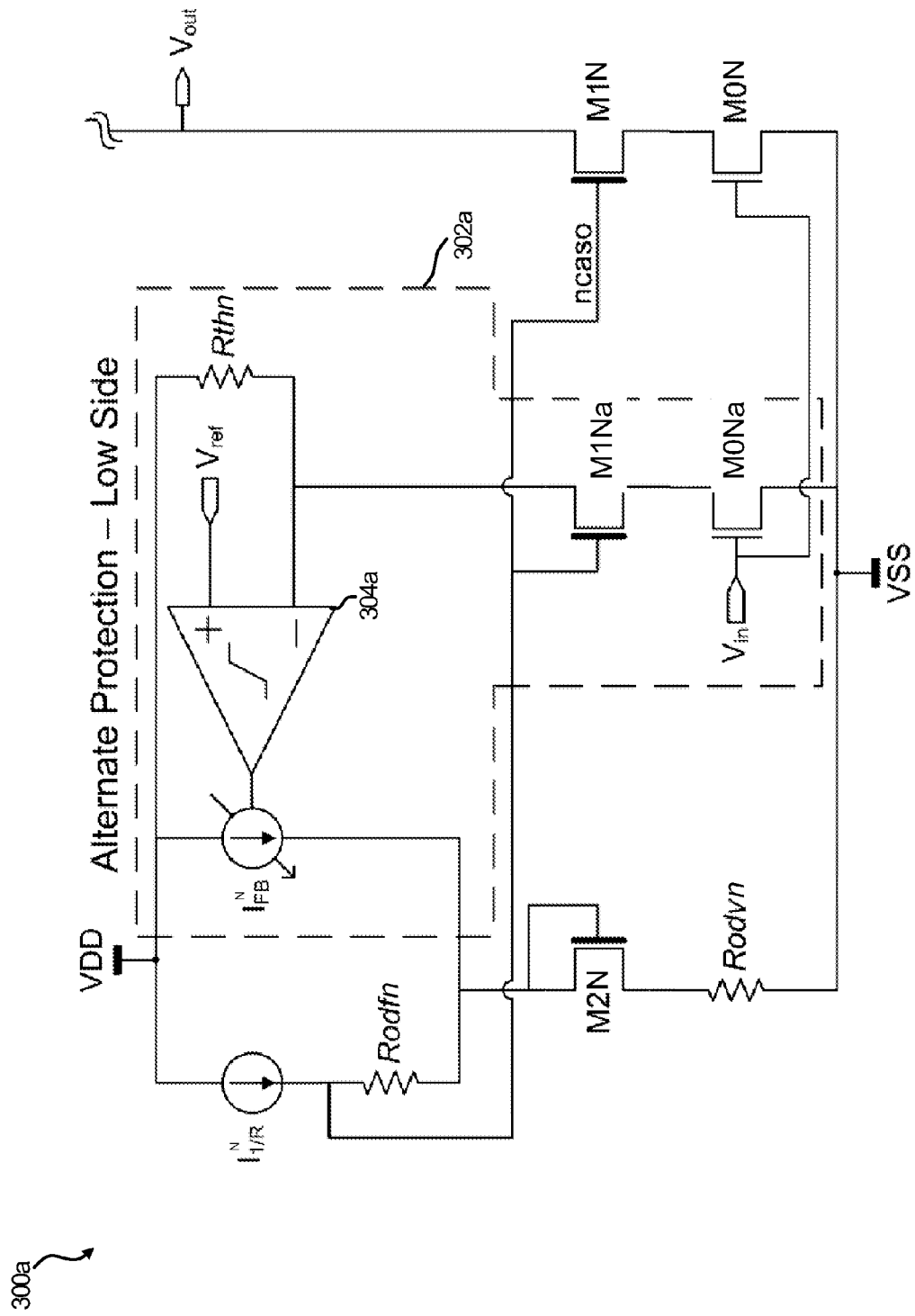
FIG. 3A is a schematic block diagram of a low side of an amplifier output stage using alternate protection, in accordance with an embodiment of the disclosure.

FIG. 3A is a schematic block diagram of a low side of an amplifier output stage using alternate protection, in accordance with an embodiment of the disclosure. Referring to FIG. 3A, there is illustrated an amplifier output stage 300a (with an OVP circuit 302a and a comparator 304a), which is an alternative embodiment to the amplifier output stage 100a (with an OVP circuit 102a and comparator 104a) of FIG. 1A.

More specifically, in instances when the polarity relationship between the output voltage (Vout) and the output current is known and constant across all operating modes, the resistive divider (R1N-R2N in FIG. 1A) may be replaced with a transistor pair M1Na-M0Na, which is a replica of the output stage transistor pair M1N-M0N. In this regard, the replica transistor pair M1Na-M0Na may be operable to provide current through a resistive load Rthn in order to develop the dynamic comparator input.

Figure 3B:
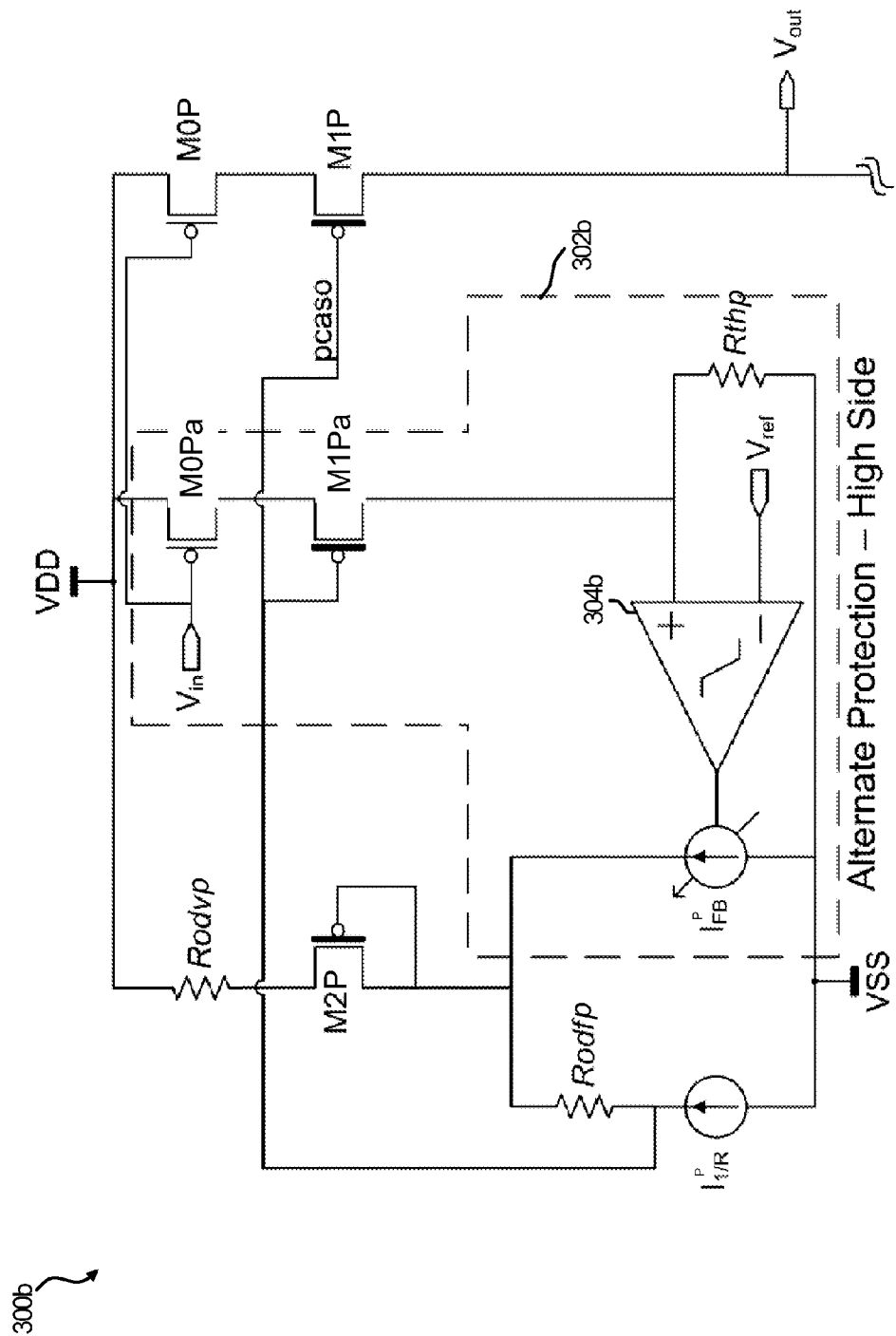
FIG. 3B is a schematic block diagram of a high side of an amplifier output stage using alternate protection, in accordance with an embodiment of the disclosure.

FIG. 3B is a schematic block diagram of a high side of an amplifier output stage using alternate protection, in accordance with an embodiment of the disclosure. Referring to FIG. 3B, there is illustrated an amplifier output stage 300b (with an OVP circuit 302b and a comparator 304b), which is an alternative embodiment to the amplifier output stage 100b (with an OVP circuit 102b and comparator 104b) of FIG. 1B.

More specifically, in instances when the polarity relationship between the output voltage (Vout) and the output current is known and constant across all operating modes, the resistive divider (R1P-R2P in FIG. 1B) may be replaced with a transistor pair M1Pa-M0Pa, which is a replica of the output stage transistor pair M1P-M0P. In this regard, the replica transistor pair M1Pa-M0Pa may be operable to provide current through a resistive load Rthp in order to develop the dynamic comparator input.

With reference to FIGS. 3A-3B, two fault conditions may be relevant. In the first, Vout may be shorted to VSS (or VDD) (i.e. a common-mode short). In that instance, the voltage at Vout will fall (rise) as it sources (sinks) high current. Conversely, in a differential system, it may be possible that Vout+ and Vout− are shorted to one another (i.e., a different short). If this occurs while a large signal is being transmitted, the voltage at Vout+ (as opposed to Vout−) will rise (fall) as it sources (sinks) current. Since the relationship between voltage and current polarity is precisely opposite in these two cases, in general it may be difficult to sense current in order to infer whether the OVP circuit may be necessary. However, when the latter case is not of concern (e.g. in a single-ended system), it may be possible to modify the sense mechanism to rely on a replica of the output current, resulting in the common-mode short-circuit protection alternative depicted in FIGS. 3A-3B for the low and high sides of the amplifier output stage, respectively.

Figure 4:
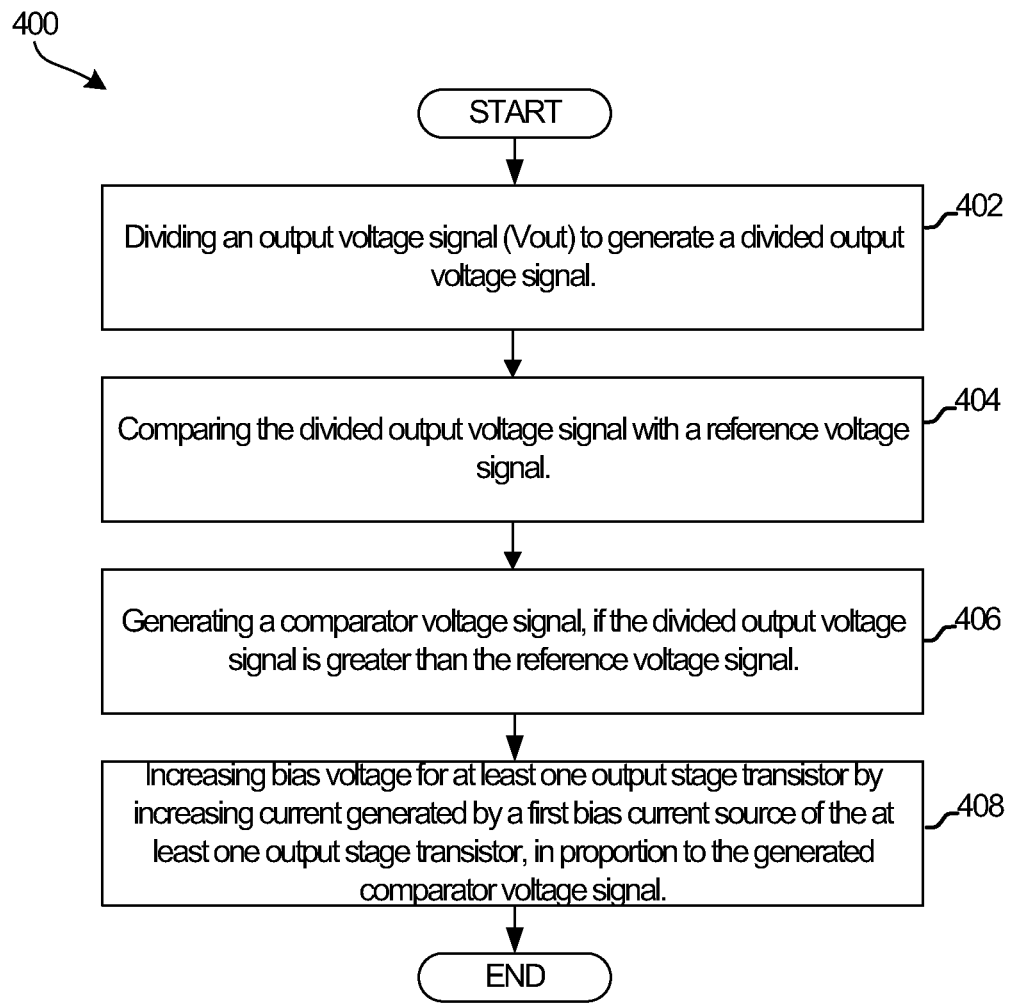
FIG. 4 is a flow chart illustrating example steps of a method for processing signals in a low side of an amplifier output stage using over-voltage protection, in accordance with an embodiment of the disclosure.

FIG. 4 is a flow chart illustrating example steps of a method for processing signals in a low side of an amplifier output stage using over-voltage protection, in accordance with an embodiment of the disclosure. Referring to FIGS. 1A, 2A, and 4, the method 400 for processing signals may start at 402, when an output voltage signal (Vout) may be divided by resistor divider R1N-R2N to generate a divided output voltage signal. At 404, the comparator 104a may compare the divided output voltage signal with a reference voltage signal (Vref). At 406, if the divided output voltage signal is greater than the reference voltage signal Vref, the comparator 104a may generate a comparator voltage signal. The comparator voltage signal may be communicated to the first bias current source $I^{N}_{FB}$. At 408, the bias voltage of the output stage transistors M1N-M0N—ncaso—may be increased by increasing the current generated by the first bias current source $I^{N}_{FB}$, in proportion to the generated comparator voltage signal.

The output stage transistors M1N-M0N may be dynamically biased based on the generated comparator voltage signal. The comparator voltage signal may be generated using at least one differential pair (e.g., M3N-M4N with a current source $I^{N}_{T}$) with a current mirror load of transistors M5N-M6N. The bias voltage ncaso for the output stage transistors M1N-M0N may include a fixed voltage component and a variable voltage component. The fixed voltage component may be generated using a fixed resistor load (e.g., Rodfn) and a second bias current source (e.g., $I^{N}_{1/R}$) of the output stage transistors. The bias voltage ncaso may be increased by, for example, overdriving the variable voltage component of the bias voltage ncaso. The overdriving may include increasing the current generated by the first bias current source (e.g., $I^{N}_{FB}$) of the output stage transistors M1N-M0N. The current from the source $I^{N}_{FB}$ may pass through a replica diode (e.g., M2N) and a resistor (e.g., Rodvn) of the output stage transistors M1N-M0N.

Figure 5:
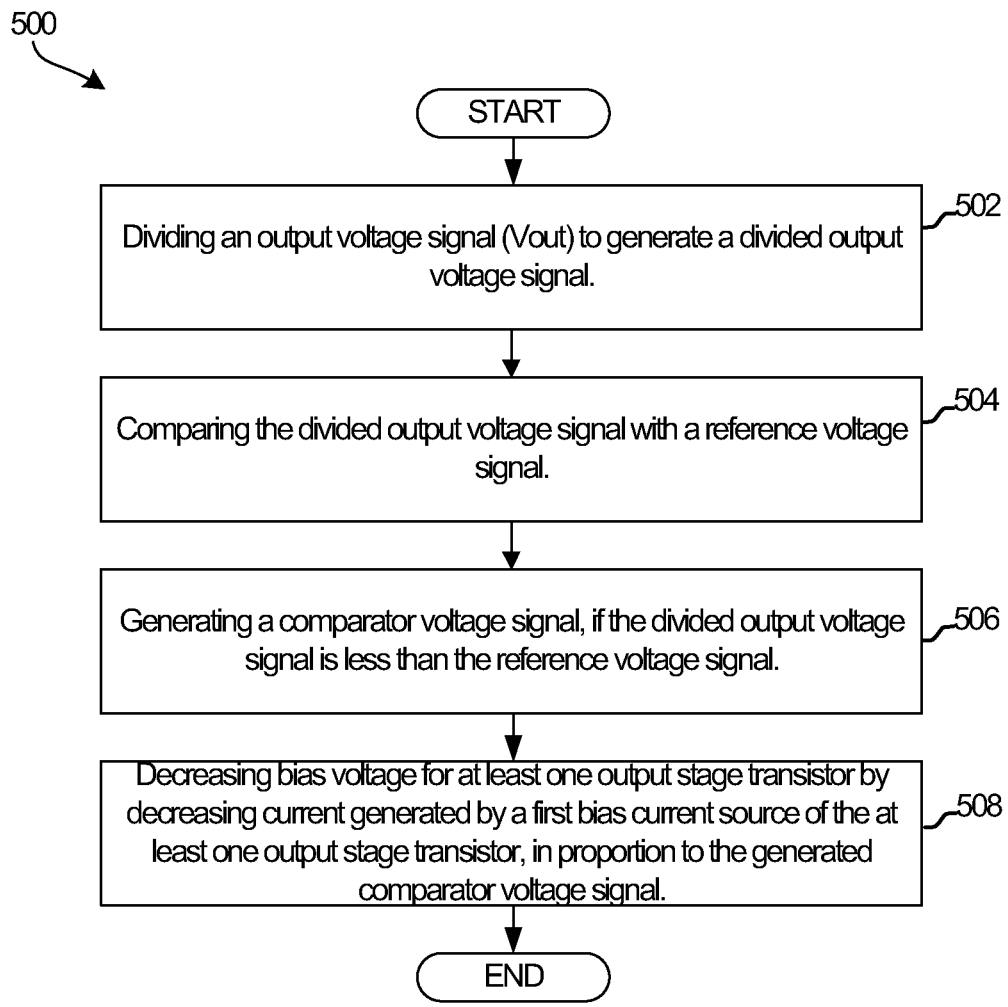
FIG. 5 is a flow chart illustrating example steps of a method for processing signals in a high side of an amplifier output stage using over-voltage protection, in accordance with an embodiment of the disclosure.

FIG. 5 is a flow chart illustrating example steps of a method for processing signals in a high side of an amplifier output stage using over-voltage protection, in accordance with an embodiment of the disclosure. Referring to FIGS. 1B, 2B, and 5, the method 500 for processing signals may start at 502, when an output voltage signal (Vout) may be divided by resistor divider R1P-R2P to generate a divided output voltage signal. At 504, the comparator 104b may compare the divided output voltage signal with a reference voltage signal (Vref). At 506, if the divided output voltage signal is less than the reference voltage signal Vref, the comparator 104b may generate a comparator voltage signal. The comparator voltage signal may be communicated to the first bias current source $I^{P}_{FB}$. At 508, the bias voltage of the output stage transistors M1P-M0P—pcaso—may be decreased by increasing the current generated by the first bias current source $I^{P}_{FB}$, in proportion to the generated comparator voltage signal.

The output stage transistors M1P-M0P may be dynamically biased based on the generated comparator voltage signal. The comparator voltage signal may be generated using at least one differential pair (e.g., M3P-M4P with a current source $I^{P}_{T}$) with a current mirror load of transistors M5P-M6P. The bias voltage pcaso for the output stage transistors M1P-M0P may include a fixed voltage component and a variable voltage component. The fixed voltage component may be generated using a fixed resistor load (e.g., Rodfp) and a second bias current source (e.g., $I^{P}_{1/R}$) of the output stage transistors. The bias voltage pcaso may be decreased by, for example, overdriving the variable voltage component of the bias voltage pcaso. The overdriving may include increasing the current generated by the first bias current source (e.g., $I^{P}_{FB}$) of the output stage transistors M1P-M0P. The current from the source $I^{P}_{FB}$ may pass through a replica diode (e.g., M2P) and a resistor (e.g., Rodvp) of the output stage transistors M1P-M0P.

In accordance with an embodiment of the disclosure, an over-voltage protection circuit (e.g., OVP circuit 102a in FIG. 1A) may include a divider (e.g., resistor divider R1N-R2N) that is operable to divide an output voltage signal (Vout) in an output stage of an amplifier (e.g., 100a) to generate a divided output voltage signal. A comparator (e.g., 104a) may be operable to compare the divided output voltage signal in with a reference voltage signal (e.g., Vref) to generate a comparator voltage signal. A first bias current source (e.g., $I^{N}_{FB}$) coupled to the comparator and at least one output stage transistor (e.g., M0N-M1N). If the divided output voltage signal is greater than the reference voltage signal (Vref), the first bias current source ($I^{N}_{FB}$) may be operable to increase bias voltage ncaso for the at least one output stage transistor (M0N-M1N) by increasing its current in proportion to the generated comparator voltage signal.

The bias voltage ncaso for at least one output stage transistor may include a fixed voltage component and a variable voltage component. A second bias current source (e.g., $I^{N}_{1/R}$) of the at least one output stage transistor may be operable to generate the fixed voltage component using a first fixed resistor load (e.g., Rodfn). A replica diode (e.g., M2N) may be coupled to a second fixed resistor load (e.g., Rodvn). The first bias current source ($I^{N}_{FB}$) may be operable to increase the bias voltage ncaso for the at least one output stage transistor (M0N-M1N) by increasing the current passing through the replica diode and the second fixed resistor load (Rodvn).

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for managing information.

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A method comprising:
- comparing an output voltage signal in an output stage of an amplifier with a reference voltage signal;
- generating a comparator voltage signal, if the output voltage signal is greater than the reference voltage signal; and
- increasing bias voltage for at least one output stage transistor by increasing current generated by a first bias current source of the at least one output stage transistor, in proportion to the generated comparator voltage signal,
- wherein the bias voltage for the at least one output stage transistor comprises a fixed voltage component and a variable voltage component.

2. The method according to claim 1, comprising dividing the output voltage signal prior to the comparing.

3. The method according to claim 1, comprising dynamically biasing the at least one output stage transistor based on the generated comparator voltage signal.

4. The method according to claim 1, comprising:
- generating the comparator voltage signal using at least one differential pair with a current mirror load.

5. The method according to claim 1, comprising:
- generating the fixed voltage component using a fixed resistor load and a second bias current source of the at least one output stage transistor.

6. The method according to claim 5, comprising:
- increasing the bias voltage for the at least one output stage transistor by overdriving the variable voltage component of the bias voltage.

7. The method according to claim 6, wherein the overdriving comprises:
- increasing the current generated by the first bias current source of the at least one output stage transistor, wherein the current passes through a replica diode of the at least one output stage transistor and a second fixed resistor load.

8. A method comprising:
- comparing an output voltage signal in an output stage of an amplifier with a reference voltage signal;
- generating a comparator voltage signal, if the output voltage signal is less than the reference voltage signal; and
- decreasing bias voltage for at least one output stage transistor by increasing current generated by a first bias current source of the at least one output stage transistor, in proportion to the generated comparator voltage signal,
- wherein the bias voltage for the at least one output stage transistor comprises a fixed voltage component and a variable voltage component.

9. The method according to claim 8, comprising dividing the output voltage signal prior to the comparing.

10. The method according to claim 8, comprising dynamically biasing the at least one output stage transistor based on the generated comparator voltage signal.

11. The method according to claim 8, comprising:
- generating the comparator voltage signal using at least one differential pair with a current mirror load.

12. The method according to claim 8, comprising:
- generating the fixed voltage component using a fixed resistor load and a second bias current source of the at least one output stage transistor.

13. The method according to claim 12, comprising:
- decreasing the bias voltage for the at least one output stage transistor by overdriving the variable voltage component of the bias voltage.

14. The method according to claim 13, wherein the overdriving comprises:
- increasing the current generated by the first bias current source of the at least one output stage transistor, wherein the current passes through a replica diode of the at least one output stage transistor and a second fixed resistor load.

15. An over-voltage protection circuit, comprising:
- a divider that is operable to divide an output voltage signal in an output stage of an amplifier to generate a divided output voltage signal;
- a comparator that is operable to compare the divided output voltage signal in with a reference voltage signal to generate a comparator voltage signal; and
- a first bias current source coupled to the comparator and at least one output stage transistor, wherein:
  - the first bias current source is operable to increase bias voltage, if the divided output voltage signal is greater than the reference voltage signal, for the at least one output stage transistor by increasing current in proportion to the generated comparator voltage signal,
- wherein the bias voltage for the at least one output stage transistor comprises a fixed voltage component and a variable voltage component.

16. The over-voltage protection circuit according to claim 15, comprising:
- a second bias current source of the at least one output stage transistor, the second bias current source operable to generate the fixed voltage component using a first fixed resistor load.

17. The over-voltage protection circuit according to claim 16, comprising:
- a replica diode coupled to a second fixed resistor load, wherein the first bias current source is operable to increasing the bias voltage for the at least one output stage transistor by increasing the current passing through the replica diode and the second fixed resistor load.

* * * * *